(12) United States Patent
Akram et al.

(10) Patent No.: US 7,858,429 B2
(45) Date of Patent: Dec. 28, 2010

(54) PACKAGED MICROELECTRONIC IMAGERS AND METHODS OF PACKAGING MICROELECTRONIC IMAGERS

(75) Inventors: Salman Akram, Boise, ID (US); Charles M. Watkins, Eagle, ID (US); Kyle K. Kirby, Boise, ID (US); Alan G. Wood, Boise, ID (US); William M. Hiatt, Eagle, ID (US)

(73) Assignee: Round Rock Research, LLC, Mount Kisco, NY (US)

( * ) Notice: Subject to any disclaimer, the term of this patent is extended or adjusted under 35 U.S.C. 154(b) by 107 days.

(21) Appl. No.: 11/863,087

(22) Filed: Sep. 27, 2007

(65) Prior Publication Data
US 2008/0020505 A1 Jan. 24, 2008

Related U.S. Application Data

(62) Division of application No. 10/879,398, filed on Jun. 29, 2004, now Pat. No. 7,294,897.

(51) Int. Cl.
*H01L 21/00* (2006.01)
*G02F 1/13* (2006.01)

(52) U.S. Cl. ............................ 438/69; 438/70; 438/98; 438/193

(58) Field of Classification Search ................ None
See application file for complete search history.

(56) References Cited

U.S. PATENT DOCUMENTS 3,345,134 A 10/1967 Heymer et al.
4,534,100 A 8/1985 Lane
4,906,314 A 3/1990 Farnworth et al.
5,130,783 A 7/1992 McLellan (Continued)

FOREIGN PATENT DOCUMENTS

EP 0 886 323 12/1998

(Continued)

OTHER PUBLICATIONS

U.S. Appl. No. 10/785,466, Kirby.

(Continued)

*Primary Examiner*—Zandra Smith
*Assistant Examiner*—Pamela E Perkins
(74) *Attorney, Agent, or Firm*—Lerner, David, Littenberg, Krumholz & Mentlik, LLP (57) ABSTRACT

Microelectronic imagers, methods for packaging microelectronic imagers, and methods for forming electrically conductive through-wafer interconnects in microelectronic imagers are disclosed herein. In one embodiment, a microelectronic imaging die can include a microelectronic substrate, an integrated circuit, and an image sensor electrically coupled to the integrated circuit. A bond-pad is carried by the substrate and electrically coupled to the integrated circuit. An electrically conductive through-wafer interconnect extends through the substrate and is in contact with the bond-pad. The interconnect can include a passage extending completely through the substrate and the bond-pad, a dielectric liner deposited into the passage and in contact with the substrate, first and second conductive layers deposited onto at least a portion of the dielectric liner, and a conductive fill material deposited into the passage over at least a portion of the second conductive layer and electrically coupled to the bond-pad.

34 Claims, 9 Drawing Sheets

U.S. PATENT DOCUMENTS

| | | | |
|---|---|---|---|
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |
| 5,708,293 A | 1/1998 | Ochi et al. |
| 5,771,158 A | 6/1998 | Yamagishi et al. |
| 5,776,824 A | 7/1998 | Farnworth et al. |
| 5,811,799 A | 9/1998 | Wu |
| 5,821,532 A | 10/1998 | Beaman et al. |
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,235,554 B1 | 5/2001 | Akram et al. |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,667,551 B2 | 10/2001 | Hanaoka et al. |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 | 1/2003 | Glenn et al. |
| 6,534,863 B2 | 3/2003 | Walker et al. |
| 6,541,762 B2 | 4/2003 | Knag et al. |
| 6,560,047 B2 | 5/2003 | Kim et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,670,986 B1 | 12/2003 | Shoshan et al. |
| 6,686,588 B1 | 2/2004 | Webster et al. |
| 6,703,310 B2 | 3/2004 | Mashino et al. |
| 6,703,689 B2 | 3/2004 | Wada |
| 6,864,172 B2 | 4/2004 | Noma et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 2002/0006687 A1 | 1/2002 | Lam |
| 2002/0019069 A1 | 2/2002 | Wada |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0012698 A1 | 1/2004 | Suda et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0214373 A1 | 10/2004 | Jiang et al. |
| 2004/0245649 A1 | 12/2004 | Imaoka |
| 2005/0029643 A1 | 2/2005 | Koyanagi |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |
| 2005/0275048 A1 | 12/2005 | Farnworth et al. |
| 2005/0275750 A1* | 12/2005 | Akram et al. ............ 348/374 |

FOREIGN PATENT DOCUMENTS

| | | |
|---|---|---|
| EP | 1 157 967 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO 90/05424 A1 | 5/1990 |
| WO | WO 02/075815 A1 | 9/2002 |
| WO | WO 02/095796 A2 | 11/2002 |
| WO | WO/03/041174 | 5/2003 |
| WO | WO 2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
Aachboun and Ranson, "Cryogenic etching of deep narrow trenches in silicon," J. Vac. Sci. Technol. A 18(4), Jul./Aug. 2000, pp. 1848-1852.

Aachboun and Ranson, "Deep anisotropic etching of silicon," J. Vac. Sci. Technol. A 17(4), Jul./Aug. 1999, pp. 2270-2273.

Austin and Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

U.S. Appl. No. 11/218,126, Farnworth et al.

U.S. Appl. No. 11/218,243, Kirby et al.

Blackburn et al., "Deposition of Conformal Copper and Nickel Films from Supercritical Carbon Dioxide," Science, vol. 294, pp. 141-145, Oct. 5, 2001.

Brubaker et al., "Ultra-thick Litghography for Advanced Packaging and MEMS," SPIE's 27th Annual International Symposium on Microlithography 2002, Mar. 3-8, 2002, Santa Clara, CA.

Cheng et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industries Optics, Mounted IR Filters, 1 page, retrieved from the Internet on Jun. 30, 2003, <http://www.edmundoptics.com>.

Hamdorf et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune et al., "Packaging technology for imager using through-hole interconnection in Si Substrate," Proceeding of HDP'04, IEEE, pp. 303-306, Jul. 2004.

IBM, Zurich Research Laboratory, EPON Su-8 Photoresist, 1 page, retrieved from the Internet on Jan. 21, 2003, <http://www.zurich.ibm.com/st/mems/su8.html>.

Intrinsic Viscosity and its relation to intrinsic conductivity, 9 pages, retrieved from the Internet on Oct. 30, 2003, <http://www.ciks.cbt.nist.gov/~garbocz/paper58/node3.html>.

King et al., Optomec, Inc., M3D™ Technology, Maskless Mesoscale™ Materials Deposition, 5 pages, http://www.optomec.com/downloads/M3D%20White%Paper%20080502.pdf, retrieved from the Internet on Jun. 17, 2005.

Kingpak Technology, Inc., "CMOS Image Sensor Packaging," 1 page, retrieved from the Internet on Aug. 26, 2003, <http://www.kingpak.com/CMOSImager.html>.

Kramer et al., "Annual report—applications of supercritical fluid technology to semiconductor device processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin and Yoon, "One package technique of exposed MEMS sensors," pp. 105-108, 2002 International Symposium on Microelectroncis Sep. 2002.

Ma et al., "Low temperature bonding for water scale packaging and assembly of micromachined sensors," Final report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technonogy, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Depositoin, 2 pages, <http://www.optomec.com/downloads/M3DSheet.pdf>, retrieved from the Internet on Jun. 17, 2005.

Photo Visision Systems, Inc., "Advances in Digital Image Sensors," 22 pages, First Annual New York State Conference on Microelectronic Design, Jan. 12, 2002.

Shen et al., "Microplastic embossing process: experimental and theoretical characterizations," Sensors and Actuators, A 97-98 (2002) pp. 428-433, Elsevier Science B.V.

Tapes II International Tape and fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfoloio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrate," 3 pages, Fall 1999.

UCI Integrated Nanosystems Research Facility, "Glass Etch Wet Process," 3 pages, Summer 2000.

Walker, "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye et al., "Immersion deposition of metal films on silicon and germanium substrates in supercritical carbon dioxide," Chem. Mater. 2003, 15, 83-91.

Yoshida, "TransChip rolls out a single-chip CMOS imager," 3 pages, EE Times, Jul. 18, 2003.

International Search Report and Written Opinion for PCT/US2004/037415, mailed Jul. 5, 2005.

Korean Intellectual Property Office paper issued on Jul. 22, 2008.

H. Kurino et al., Intelligent Image Sensor Chip with Three Dimensional Structure, Dec. 5-8, 1999, IEDM Technical Digest. InternationalElectron Devices Meeting, pp. 879-882.

* cited by examiner

Fig. 6

PACKAGED MICROELECTRONIC IMAGERS AND METHODS OF PACKAGING MICROELECTRONIC IMAGERS

This application is a divisional application of U.S. application Ser. No. 10/879,398, filed on Jun. 29, 2004, now U.S. Pat. No. 7,294,897 the entire disclosure of which is incorporated herein by reference.

TECHNICAL FIELD

The following disclosure relates generally to microelectronic devices and methods for packaging microelectronic devices. Several aspects of the present invention are directed toward packaging microelectronic imagers that are responsive to radiation in the visible light spectrum or radiation in other spectrums.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

Figure 1:
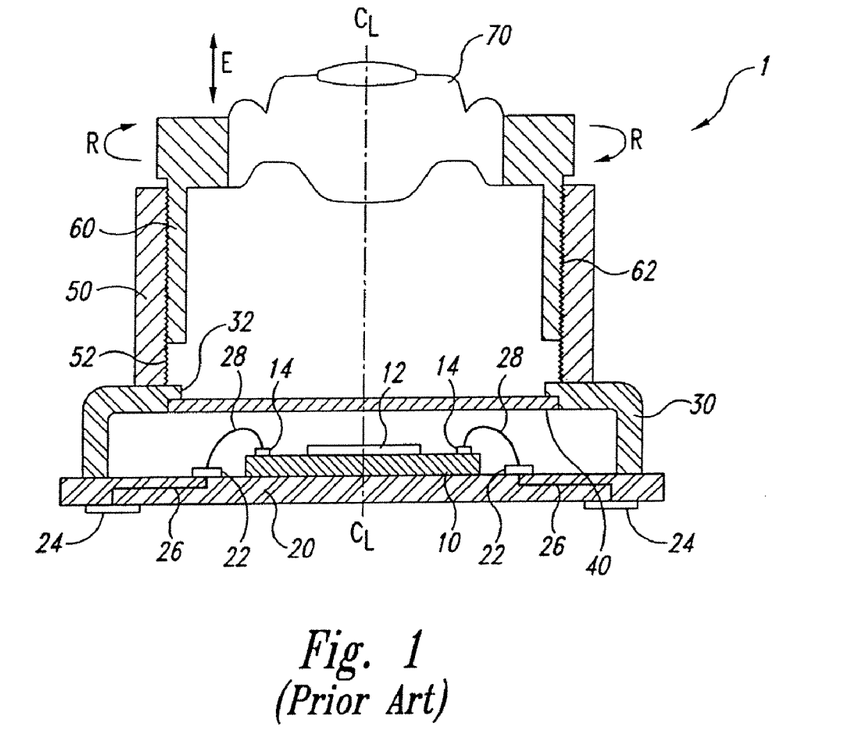
FIG. 1 is a cross-sectional view of a packaged microelectronic imager in accordance with the prior art.

FIG. 1 is a schematic view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that they have relatively large footprints and occupy a significant amount of vertical space (i.e., high profiles). The footprint of the imager in FIG. 1 is the surface area of the bottom of the interposer substrate 20. This is typically much larger than the surface area of the die 10 and can be a limiting factor in the design and marketability of picture cell phones or PDAs because these devices are continually shrinking to be more portable. Therefore, there is a need to provide microelectronic imagers with smaller footprints and lower profiles.

Another problem with packaging conventional microelectronic imagers is the manufacturing costs for packaging the dies. Forming the wire bonds 28, for example, in the imager 1 shown in FIG. 1 can be complex and/or expensive because it requires individual wires between each set of bond-pads and ball-pads. In addition, it may not be feasible to form wire-bonds for the high-density, fine-pitch arrays of some high-performance devices. Therefore, there is a significant need to enhance the efficiency, reliability, and precision of packaging microelectronic imagers.

DETAILED DESCRIPTION

A. Overview

The following disclosure describes several embodiments of microelectronic imagers, methods for packaging microelectronic imagers, and methods for forming electrically conductive interconnects in microelectronic imagers. One particular embodiment of the invention is directed toward a microelectronic imaging die comprising a microelectronic substrate, an integrated circuit, and an image sensor electrically coupled to the integrated circuit. The imaging die further includes an electrical terminal (e.g., bond-pad) electrically coupled to the integrated circuit and an electrically conductive through-wafer interconnect extending through at least a portion of the substrate. One end of the interconnect contacts the bond-pad, and the other end of the interconnect can contact a ball-pad on the backside of the die.

Another particular embodiment of the invention is directed toward a method for manufacturing a microelectronic imaging die. The method can include providing a microelectronic substrate having an integrated circuit and an image sensor electrically coupled to the integrated circuit, forming a bond-pad on the substrate, and electrically coupling the bond-pad to the integrated circuit. The method can further include forming a passage through the die and the bond-pad, and constructing an electrically conductive through-wafer interconnect in at least a portion of the passage so that the interconnect contacts the bond-pad. The interconnect can be constructed by depositing an electrically conductive fill material into at least a portion of the passage.

One embodiment of a method for constructing the interconnect includes cleaning the passage through the die and applying a dielectric liner to at least a portion of the passage before depositing the electrically conductive fill material into the passage. The dielectric liner electrically insulates the other components in the substrate from the electrically conductive material filling the passage. This method can further include depositing a conductive layer into at least a portion of the passage, and depositing a wetting agent over at least a portion of the conductive layer. The electrically conductive fill material can then be deposited into the passage.

Many specific details of the present invention are described below with reference to microfeature workpieces. The term "microfeature workpiece" as used throughout this disclosure includes substrates upon which and/or in which microelectronic devices, micromechanical devices, data storage elements, read/write components, and other features are fabricated. For example, such microfeature workpieces can include semiconductor wafers (e.g., silicon or gallium arsenide wafers), glass substrates, insulated substrates, and many other types of substrates. The feature sizes in microfeature workpieces can be 0.11 µm or less, but the workpieces can have larger submicron and supra-micron features.

Specific details of several embodiments of the invention are described below with reference to microelectronic imager dies and other microelectronic devices in order to provide a thorough understanding of such embodiments. Other details describing well-known structures often associated with microelectronic devices are not set forth in the following description to avoid unnecessarily obscuring the description of the various embodiments. Persons of ordinary skill in the art will understand, however, that the invention may have other embodiments with additional elements or without several of the elements shown and described below with reference to FIGS. 2-6.

In the Figures, identical reference numbers identify identical or at least generally similar elements. To facilitate the discussion of any particular element, the most significant digit or digits of any reference number refer to the Figure in which that element is first introduced. For example, element 210 is first introduced and discussed with reference to FIG. 2.

B. Microelectronic Imaging Dies with Through-Wafer Interconnects

Figure 2:
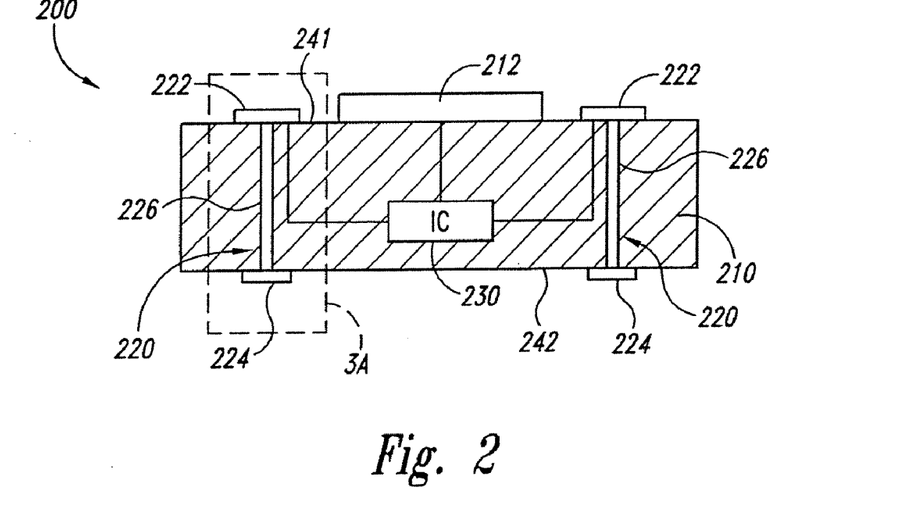
FIG. 2 is a side cross-sectional view schematically illustrating a microelectronic imaging die in accordance with an embodiment of the invention.

FIG. 2 is a side cross-sectional view of a microelectronic imaging die 200 for use in a microelectronic imager in accordance with one embodiment of the invention. In this embodiment, the microelectronic imaging die 200 includes a substrate 210 having a first side 241, a second side 242 opposite the first side 241, integrated circuitry (IC) 230 within the substrate 210, and an image sensor 212 electrically coupled to the IC 230. The image sensor 212 can be a CMOS device or a CCD for capturing pictures or other images in the visible spectrum. In other embodiments, the image sensor 212 can detect radiation in other spectrums (e.g., IR or UV ranges).

The imaging die 200 further includes a plurality of external contacts 220 for carrying electrical signals. Each external contact 220, for example, can include a bond-pad 222, a ball-pad 224, and an electrically conductive through-wafer interconnect 226 electrically coupling the bond-pad 222 to the ball-pad 224. The external contacts 220 shown in FIG. 2 accordingly provide an array of ball-pads 224 within the footprint of the imaging die 200. The ball-pads 224 can be connected to other external devices such that the imaging die 200 does not need an interposing substrate to be installed on a circuit board.

One advantage of using through-wafer interconnects 226 to electrically couple the bond-pads 222 to the ball-pads 224 is that this eliminates the need for mounting the imaging die 200 to a separate, larger interposer substrate. The imaging die 200, which has a significantly smaller footprint and profile than the interposer substrate of the conventional device shown in FIG. 1, can define the final footprint of the packaged imager. Accordingly, the imaging die 200 can be used in smaller electronic devices. Furthermore, the imaging die 200 also eliminates having to wire-bond the bond-pads to external contacts. This is useful because wire-bonds tend to break and are difficult to fabricate on high-density arrays. Accordingly, the microelectronic imaging die 200 with the through-wafer interconnects 226 is more robust than dies that require wire-bonds.

In the embodiment illustrated in FIG. 2, the processing of the imaging die 200 has been completed. As described below, FIGS. 3A-5B illustrate various embodiments of methods for forming electrically conductive through-wafer interconnects in the imaging die 200. Although the following description illustrates forming one interconnect, it will be appreciated that a plurality of interconnects are constructed simultaneously through a plurality of imaging dies on a wafer.

Figure 3A:
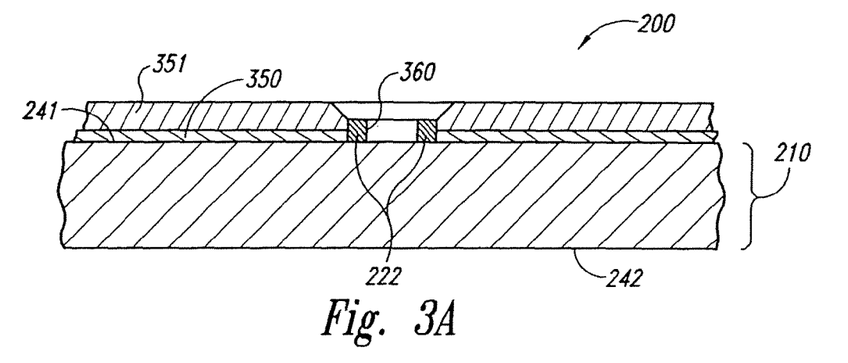
FIGS. 3A-3J are schematic side cross-sectional views illustrating various stages in a method of forming an electrically conductive interconnect through a microelectronic imaging die for providing a backside array of ball-pads in accordance with an embodiment of the invention.

FIGS. 3A-3J schematically illustrate various stages in a method of forming the through-wafer interconnect 226 in the imaging die 200 in accordance with an embodiment of the invention. FIG. 3A, more specifically, is a schematic side cross-sectional view of the area 3A shown on FIG. 2. In this embodiment, a first dielectric layer 350 is applied to the first side 241 of the substrate 210, and a second dielectric layer 351 is applied over the first dielectric layer 350. A portion of the second dielectric layer 351 over the bond-pad 222 is removed by etching or another known process to expose the bond-pad 222. After exposing the bond-pad 222, a first hole 360 is formed through the bond-pad 222. The first hole 360 can be formed by etching the center of the bond-pad 222, but in other embodiments the first hole 360 can be formed using other suitable methods (e.g., laser).

Figure 3B:
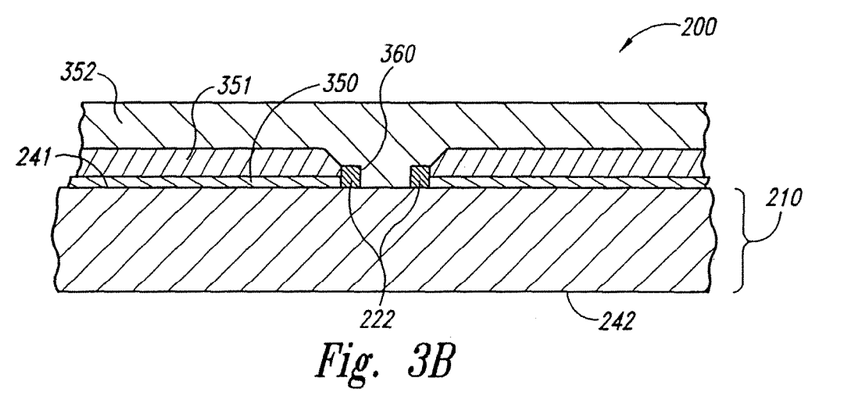

Referring now to FIG. 3B, a third dielectric layer 352 is applied over the imaging die 200 to cover the bond-pad 222 and fill the first hole 360. In one embodiment the first, second, and third dielectric layers 350, 351, 352 are a polyimide material, but these dielectric layers can be other nonconductive materials in other embodiments. For example, the first dielectric layer 350 and/or one or more subsequent dielectric layers can be a low temperature chemical vapor deposition (low temperature CVD) material, such as tetraethylorthosilicate (TEOS), parylene, silicon nitride ($Si_3N_4$), silicon oxide ($SiO_2$), and/or other suitable materials. The foregoing list of dielectric materials is not exhaustive. The dielectric layers 350, 351, 352 are not generally composed of the same materials as each other, but it is possible that two or more of these layers are composed of the same material. In addition, one or more of the layers described above with reference to FIGS. 3A and 3B, or described below with reference to subsequent figures, may be omitted.

Figure 3C:
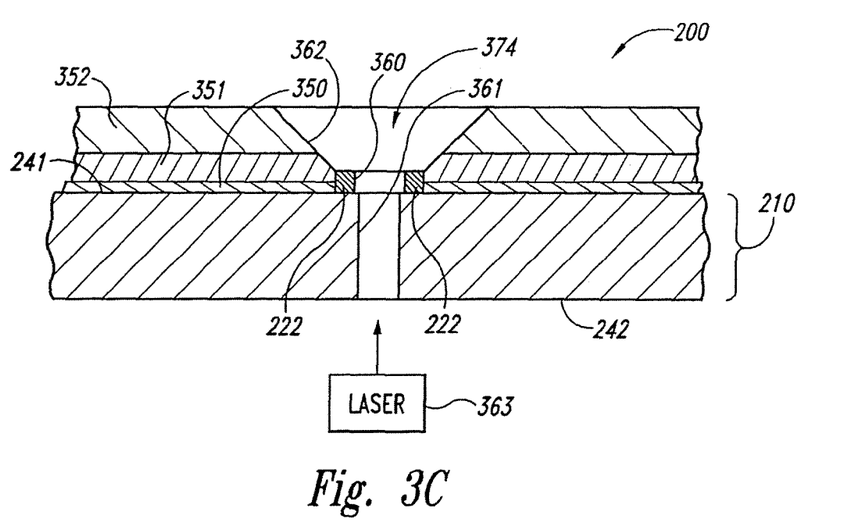

FIGS. 3C-3J are schematic side cross-sectional views similar to FIGS. 3A and 3B showing the imaging die 200 in subsequent stages of forming the through-wafer interconnect. FIG. 3C, for example, is a schematic side cross-sectional view of the imaging die 200 after a second hole 362 has been formed through the third dielectric layer 352. The second hole 362 is formed by removing a portion of the third dielectric layer 352 to open the first hole 360 and expose the bond-pad 222. The second hole 362 can be formed by etching or by other suitable methods known to those of skill in the semiconductor processing art.

FIG. 3C further illustrates cutting a passage or through-hole 361 through the substrate 210. The through-hole 361 extends through the substrate 210 to the first hole 360 in the bond-pad 222. For ease of reference, the through-hole 361 and the first hole 360 together form passage 374 extending through the imaging die 200 in the embodiment shown in FIG. 2. The through-hole 361 can be formed using a laser 363 (shown schematically) to cut through the die 200 from the second side 242 toward the first side 241. In a different embodiment, the laser 363 can conceivably cut from the first side 241 toward the second side 242. The laser 363 can be aligned with respect to the bond-pad 222 using scanning/alignment systems known in the art. In other embodiments, the through-hole 361 can be formed by suitable etching processes if the wafer is not too thick.

After forming the through-hole 361, it is cleaned to remove ablated byproducts (i.e., slag) and/or other undesirable byproducts resulting from the laser cut. The through-hole 361 can be cleaned using a wet-etch process. In the embodiment shown in FIG. 3C, the cross-sectional dimension of the through-hole 361 is less than the cross-sectional dimension of the first hole 360 in the bond-pad 222 so that the laser 363 does not impinge against the bond-pad 222. This avoids producing slag of one material in the first hole 360 through the bond-pad 222 and slag of a different material in the through-hole 361 through the substrate 210. This feature allows a single cleaning process/chemistry to clean the slag from the through-hole 361 without having to use a second cleaning process to clean residue from the first hole 360. For example, cleaning agents that do not attack the metal of the bond-pad 222 can be used to clean slag from the through-hole 361. One such cleaning agent may include 6% tetramethylammonium hydroxide (TMAH): propylene glycol for removing laser ablated byproducts. Alternatively, in certain other embodiments the through-hole 361 is not cleaned after formation.

Figure 3D:
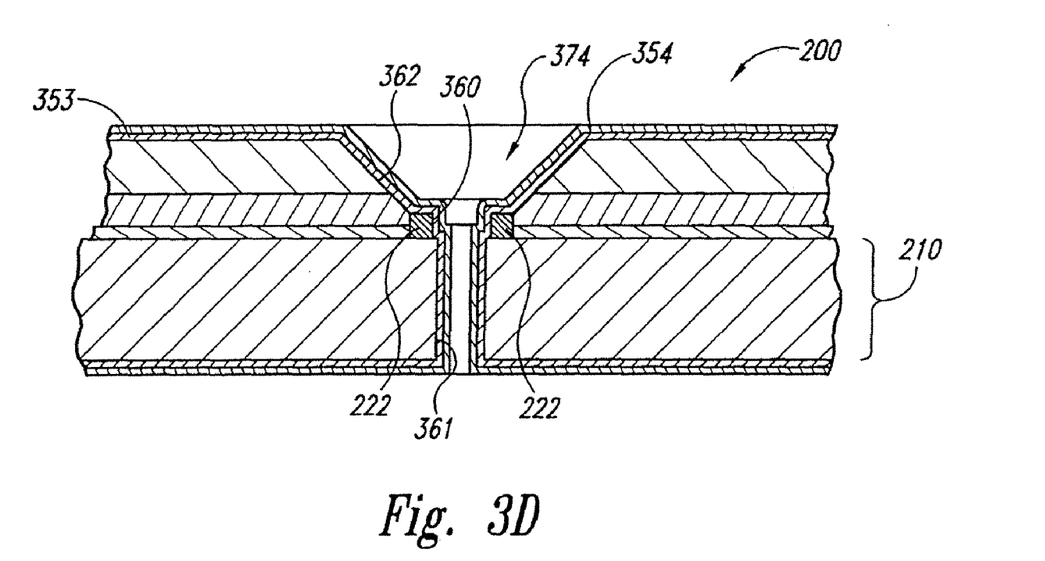

Referring to FIG. 3D, a fourth dielectric layer 353 is applied to the imaging die 200 to at least cover the sidewall of the through-hole 361 in the substrate 210. The fourth dielectric layer 353 can be applied using CVD, PVD, ALD or other deposition processes. In the illustrated embodiment the fourth dielectric layer 353 is applied to the entire imaging die 200 so that it covers the exposed portions of the substrate 210, the bond-pad 222, and the third dielectric layer 352. The fourth dielectric layer 353 can be a low temperature CVD oxide, but in other embodiments the fourth dielectric layer 353 can be other suitable dielectric materials. The fourth dielectric layer 353 electrically insulates the components of the substrate 210 from an interconnect that is subsequently formed in the passage 374 as described in greater detail below.

After applying the fourth dielectric layer 353, a first conductive layer 354 is deposited onto the imaging die 200. In the illustrated embodiment, the first conductive layer 354 covers the fourth dielectric layer 353. The first conductive layer 354 is generally a metal layer, such as a TiN layer, but in other embodiments the first conductive layer 354 can be composed of TaN, W, WN, Ta, Ti, Al, Cu, Ag, Au, Ni, Co and/or other suitable materials known to those of skill in the art. When the first conductive layer 354 is composed of TiN, it can be formed using $TiCl_4$TiN and an atomic layer deposition (ALD) or chemical vapor deposition (CVD) process. As explained below, the first conductive layer 354 provides a material for plating another layer of metal onto only selected areas of the wafer (e.g., in the through-hole 361).

Figure 3E:
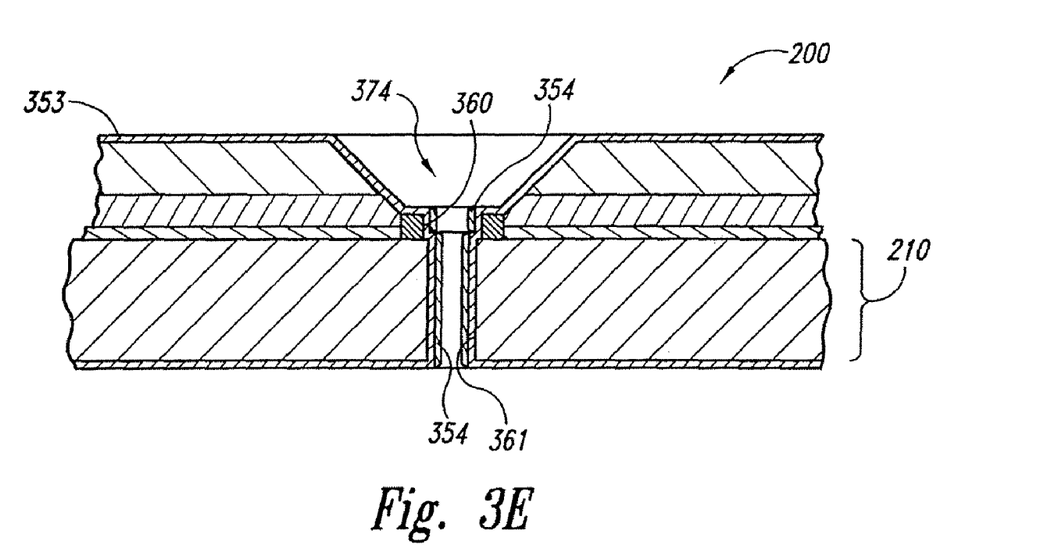

Referring next to FIG. 3E, portions of the first conductive layer 354 are removed from the horizontal and diagonal surfaces of the imaging die 200. In one embodiment, such portions of the first conductive layer 354 are removed from these surfaces by a suitable etching process, such as a "dry etch" or "spacer etch" that preferentially removes material at a higher etch rate from horizontal surfaces and surfaces having horizontal components relative to the direction of the etchant. In other embodiments, different processes can be used to selectively remove non-vertical portions of the first conductive layer 354 so that the vertical portions of the first conductive layer 354 on the sidewalls in the holes 360 and 361 remain on the workpiece.

Figure 3F:
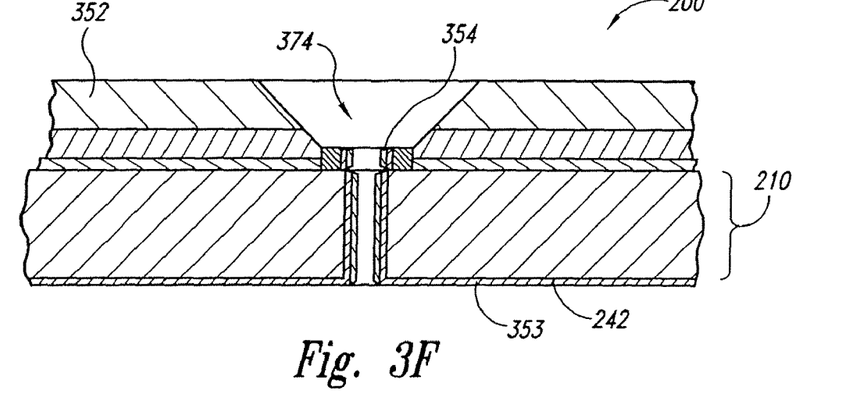
Figure 3G:
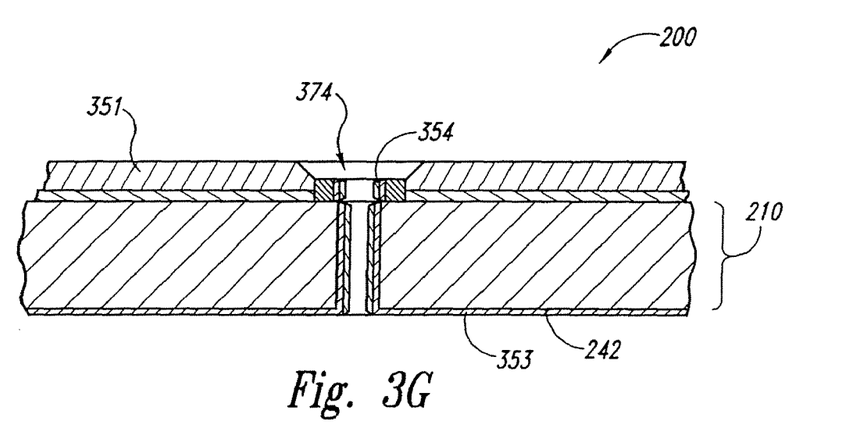

Referring next to FIGS. 3F and 3G, portions of the third dielectric layer 352 and fourth dielectric layer 353 on horizontal and diagonal surfaces of the first side 241 of the imaging die 200 are removed. The portion of the fourth dielectric layer 353 on the second side 242 of the substrate 210 remains on the imaging die 200 in this embodiment. In one embodiment, the third dielectric layer 352 and fourth dielectric layer 353 can be removed from the horizontal and diagonal surfaces of the imaging die 200 by a suitable etching process, such as a dry etch or spacer etch as described above.

Figure 3H:
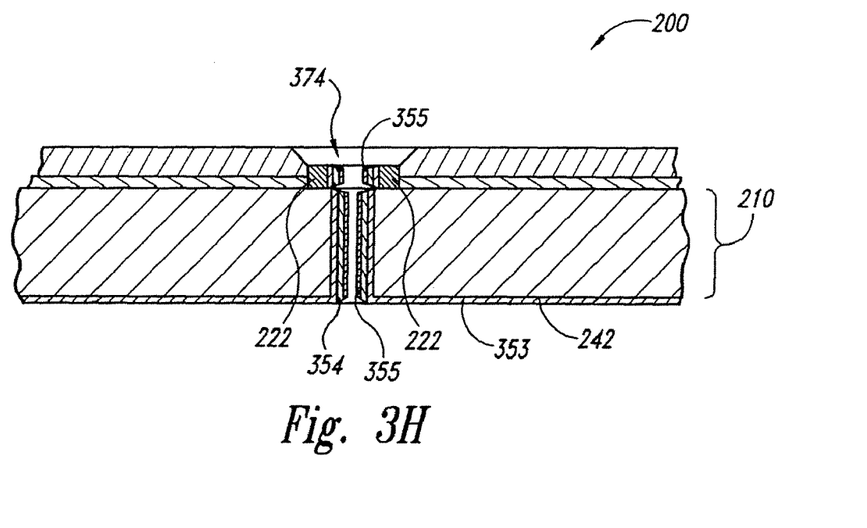

Referring to FIG. 3H, a second conductive layer 355 is applied to the remaining portions of the first conductive layer 354 in the holes 360 and 361. The second conductive layer 355 can act as a wetting agent to facilitate depositing metals into the passage 374. The second conductive layer 355 can be Ni that is deposited onto a first conductive layer 354 composed of TiN in an electroless plating operation. When the TiN is activated by an HF:Pd wet dip, it provides nucleation for the Ni during the plating process. The plating process may also be performed using an activationless Ni chemistry with reduced stabilizer content. The TiN can enhance the adhesion and electrical properties to induce nucleation. In other embodiments, the passage 374 can be coated with Cu, Au, or other suitable materials using other methods, or one or more of the first and second conductive layers 354, 355 may be omitted.

Figure 3I:
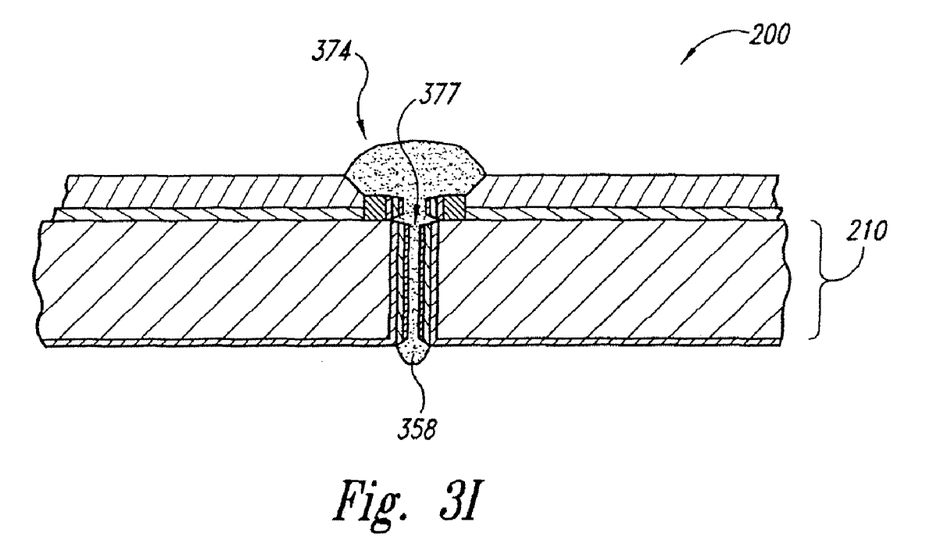

Referring next to FIG. 3I, a conductive fill material 358 is deposited into the passage 374 to form an interconnect 377 extending through the imaging die 200. In one aspect of this embodiment, the fill material 358 can be solder, copper, or other electrically conductive materials. Various processes can be used to deposit the fill material 358 into the passage 374. In one embodiment, the fill material 358 can be deposited into the passage 374 using a solder wave process. In other embodiments, the fill material 358 can be deposited by electroplating, stenciling, placing a pre-formed sphere of metal fill in the passage 374 and melting the sphere, or injecting a flowable material into the passage 374. Alternatively, in still further embodiments, the fill material 358 can be deposited into the passage 374 using other methods known to those of skill in the art.

Figure 3J:
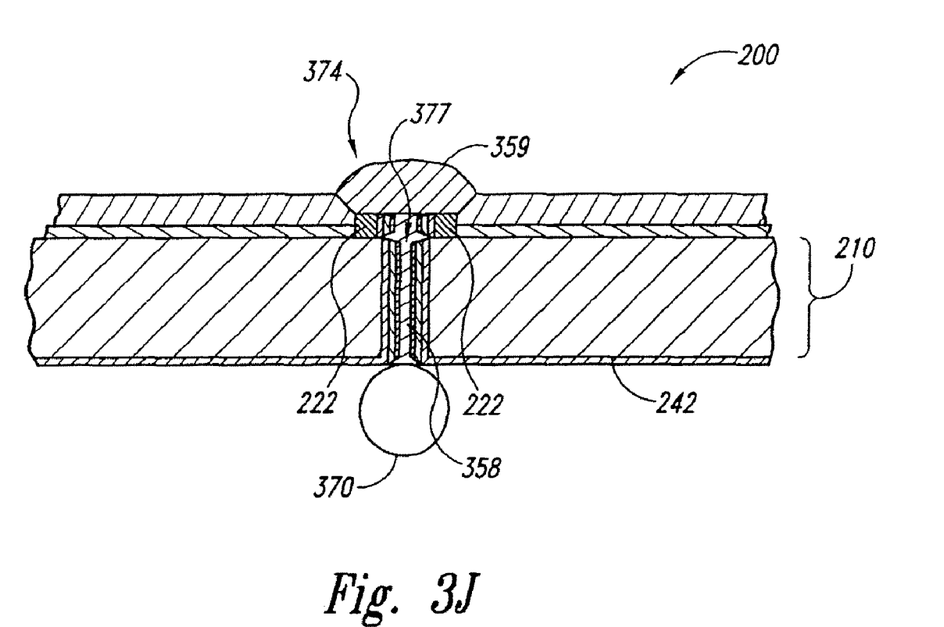

Referring next to FIG. 3J, a cap 359 can be formed at one end of the interconnect 377 after depositing the fill material 358 into the passage 374. The cap 359 electrically couples the interconnect 377 with the bond-pad 222. In one embodiment, the cap 359 can be Ni electroplated onto the interconnect 377.

In other embodiments, the cap 359 can be a wetting agent and/or other material. Alternatively, the cap 359 can be a portion of the fill material itself, or the cap 359 can be omitted. In another aspect of this embodiment, a solder ball 370 is attached to the interconnect 377 at the second side 242 of the substrate 210 to provide an external connection to other electronic devices on the backside of the imaging die 200.

In addition to requiring only a single cleaning process for the through-hole 361, another feature of the embodiments described above with reference to FIGS. 3A-3J is that the passage 374 extends through the entire imaging die 200. One advantage of this feature is that it makes the passage 374 easier to clean and fill than would otherwise be the case if the passage were "blind" (i.e., a passage that extends only partially through the workpiece). For example, in certain applications where the passage 374 has an aspect ratio of 25-30:1 or greater, a blind passage is difficult to fill with metallic materials using known physical vapor deposition (PVD), ALD, or plating processes. The passage 374 mitigates this problem because the open through-hole is not subject to "pinch-off," voids or other phenomena of filling blind holes.

Figure 4A:
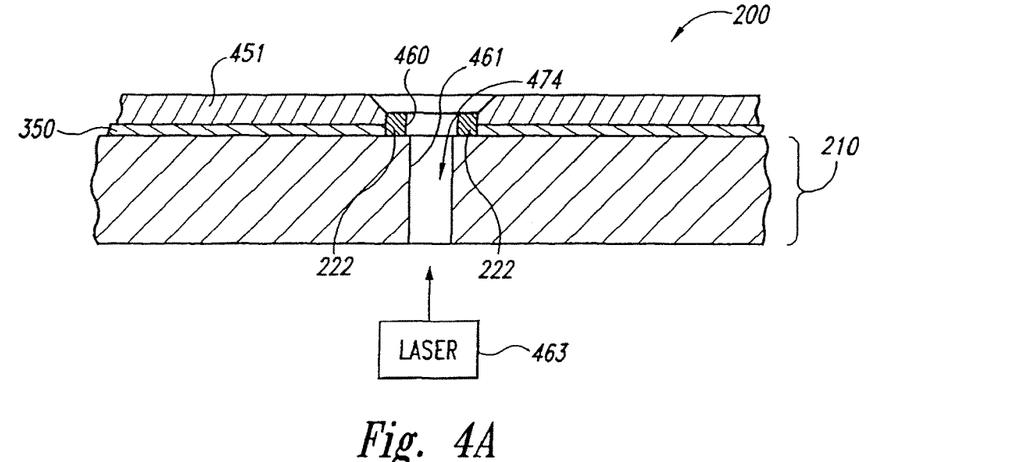
FIGS. 4A-4F are schematic side cross-sectional views illustrating various stages in a method of forming an electrically conductive interconnect through a microelectronic imaging die for providing a backside array of ball-pads in accordance with another embodiment of the invention.

FIGS. 4A-4F illustrate stages in a method of forming a through-wafer interconnect in an imaging die 200 in accordance with another embodiment of the invention. The initial stage of this method is at least generally similar to the steps described above with reference to FIG. 3A, and thus FIG. 4A shows the workpiece configuration illustrated in FIG. 3A. The subsequent stages of this method, however, differ from those described above with reference to FIGS. 3B-3F in that a third dielectric layer is not applied over the second dielectric layer 451 before cutting a through-hole 461 through the substrate 210. Therefore, referring first to FIG. 4A, the through-hole 461 is formed through the substrate 210 without having a third dielectric layer over the second dielectric layer 451. For ease of reference, the passage formed by the through-hole 461 and a first hole 460 through the bond-pad 222 is referred to as a via or passage 474 extending through the imaging die 200. The through-hole 461 can be formed using a laser 463 (shown schematically), etching, or other suitable processes as described above.

Figure 4B:
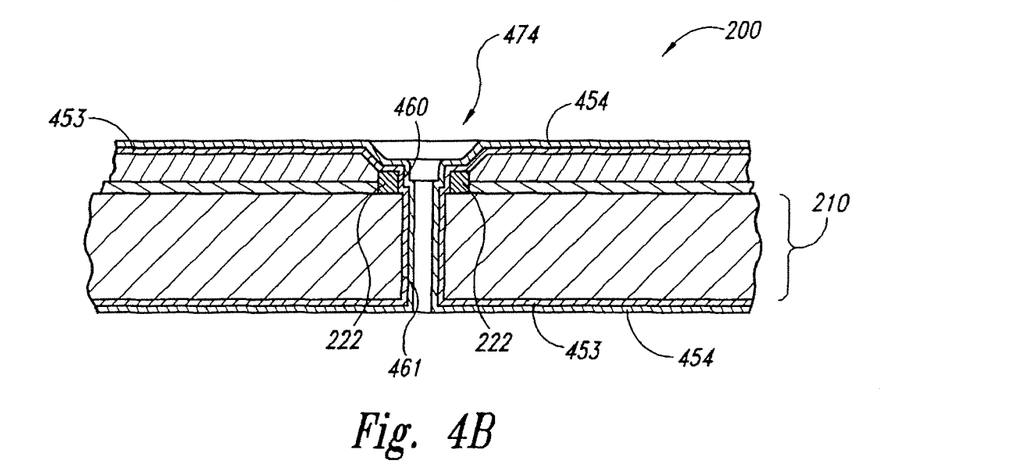

FIG. 4B illustrates additional stages of this method that are generally similar to the steps described above with reference to FIG. 3D. In a further aspect of this embodiment, however, after cleaning the through-hole 461, a third dielectric layer 453 is deposited onto the imaging die 200 to cover the sidewall of the through-hole 461 within the substrate 210. In practice, the third dielectric layer 453 generally covers the bond-pad 222 and the second dielectric layer 451 in addition to the exposed portion of the substrate 210 in the through-hole 461.

After forming the third dielectric layer 453, a first conductive layer 454 is deposited onto the imaging die 200. In the illustrated embodiment, the first conductive layer 454 covers the entire third dielectric layer 453. As explained above, the first conductive layer 454 can be a TiN layer, but the first conductive layer 454 can be a different material.

Figure 4C:
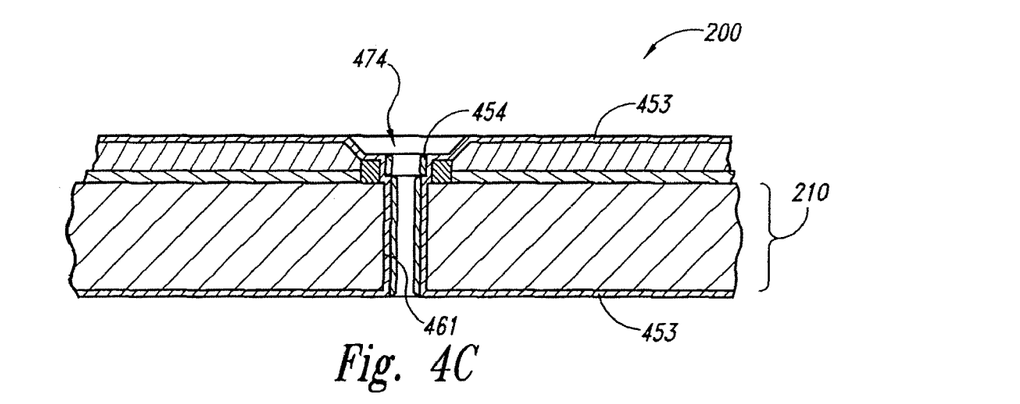
Figure 4D:
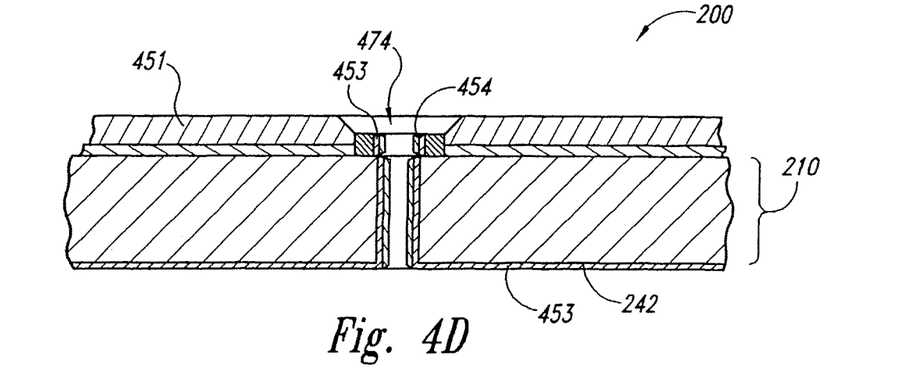

Referring next to FIG. 4C, a portion of the first conductive layer 454 is removed from the horizontal and diagonal surfaces of the imaging die 200. The first conductive layer 454 can be removed from these surfaces by a spacer etch or other process described above with respect to FIG. 3E. Referring to FIG. 4D, the portions of the third dielectric layer 453 on the upper horizontal and diagonal surfaces of the imaging die 200 are then removed to leave portions of the third dielectric layer 453 in the passageway 474 and on the second side 242 of the substrate 210. The portions of the third dielectric layer 453 on the upper horizontal and diagonal surfaces of the imaging die 200 can be removed by another spacer etch. The spacer etch of the third dielectric layer 453 should be terminated before etching through the second dielectric layer 451.

Figure 4E:
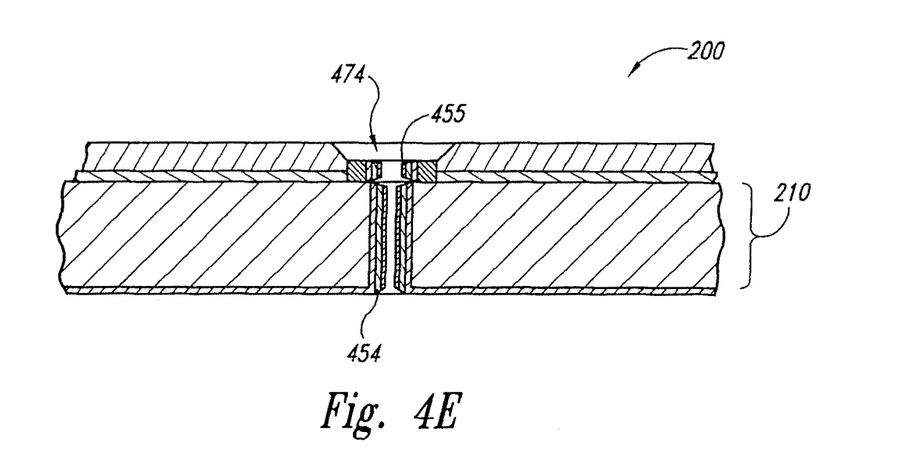
Figure 4F:
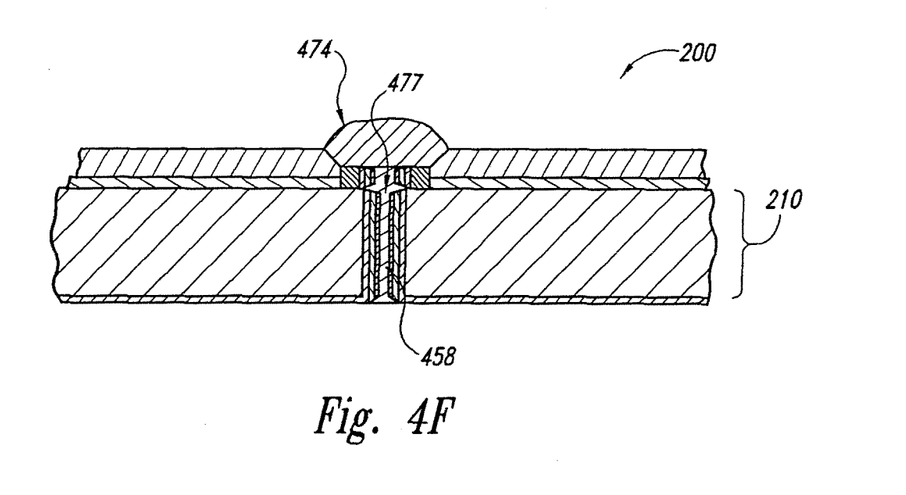

Referring to FIG. 4E, a second conductive layer 455 is then deposited onto the first conductive layer 454. The second conductive layer 455 can be a wetting agent to facilitate filling the passage 474 with a conductive material. The second conductive layer 455 can be generally similar to the second conductive layer 355 described above with respect to FIG. 3H. Referring next to FIG. 4F, a fill material 458 is deposited into the passageway 474 to construct a through-wafer interconnect 477 in a procedure generally similar to that described above with reference to FIGS. 3I-3J.

Figure 5A:
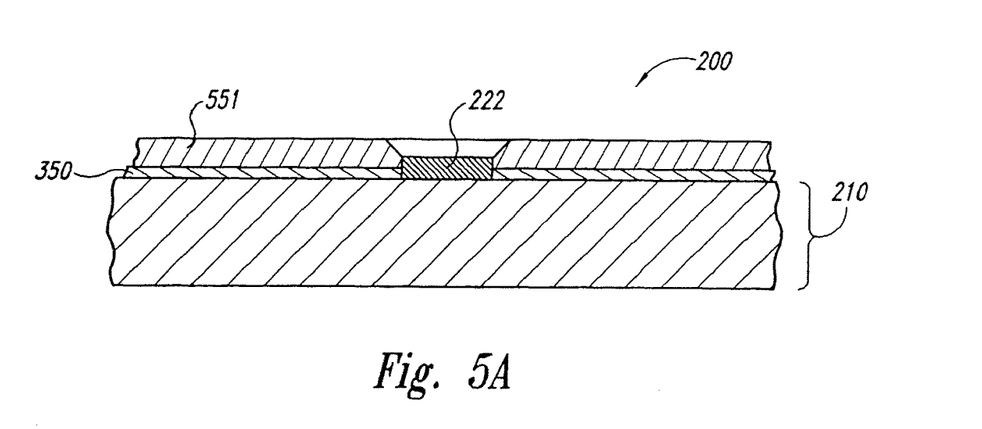
FIGS. 5A and 5B are schematic side cross-sectional views illustrating various stages in a method of forming an electrically conductive interconnect through a microelectronic imaging die for providing a backside array of ball-pads in accordance with another embodiment of the invention.
Figure 5B:
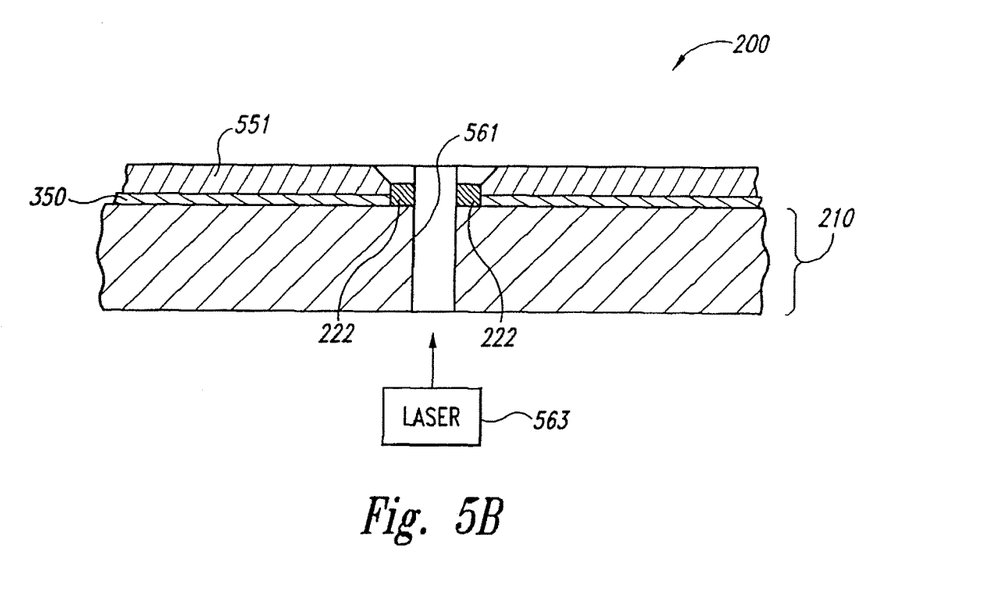

FIGS. 5A and 5B illustrate stages in a method of forming an interconnect in an imaging die 200 in accordance with another embodiment of the invention. Referring first to FIG. 5A, the first part of this method can be at least generally similar to the steps described above with reference to FIG. 3A. However, after a second dielectric layer 551 is etched to expose the bond-pad 222, a hole is not etched in the bond-pad 222.

Referring next to FIG. 5B, a through-hole 561 can be formed through the substrate 210 and the bond-pad 222. The through-hole 561 can be formed using a laser 563 (shown schematically), etching, or other suitable processes. When the laser 563 is used to form the through-hole 561, a first type of slag can coat the portion of the sidewall in the substrate 210 and a second type of slag can coat the portion of the sidewall in the bond-pad 222. As such, it may take two separate cleaning steps to clean the through-hole 561. In general, the cleaning agents used to clean the through-hole 561 may be limited to those chemistries that do not attack or otherwise degrade the metal of the bond-pad 222 or the material of the substrate 210. After the through-hole 561 has been suitably cleaned, the imaging die 200 can undergo additional packaging steps that are at least generally similar to those described above with reference to FIGS. 3C-3J to construct a through-wafer interconnect as illustrated in FIG. 3J.

The embodiments described above with reference to FIGS. 3A-5B include three methods for forming and/or filling through-holes in microfeature workpieces that extend through bond-pads and/or associated substrates. In other embodiments, other methods can be used to form and/or fill such through-holes. Accordingly, the present invention is not limited to the particular methods for forming and/or filling the through-holes described above, but it also includes alternative methods for providing an electrically conductive material in a through-hole to form an array of ball-pads on the backside of the imager die.

C. Microelectronic Imagers with Through-Wafer Interconnects

Figure 6:
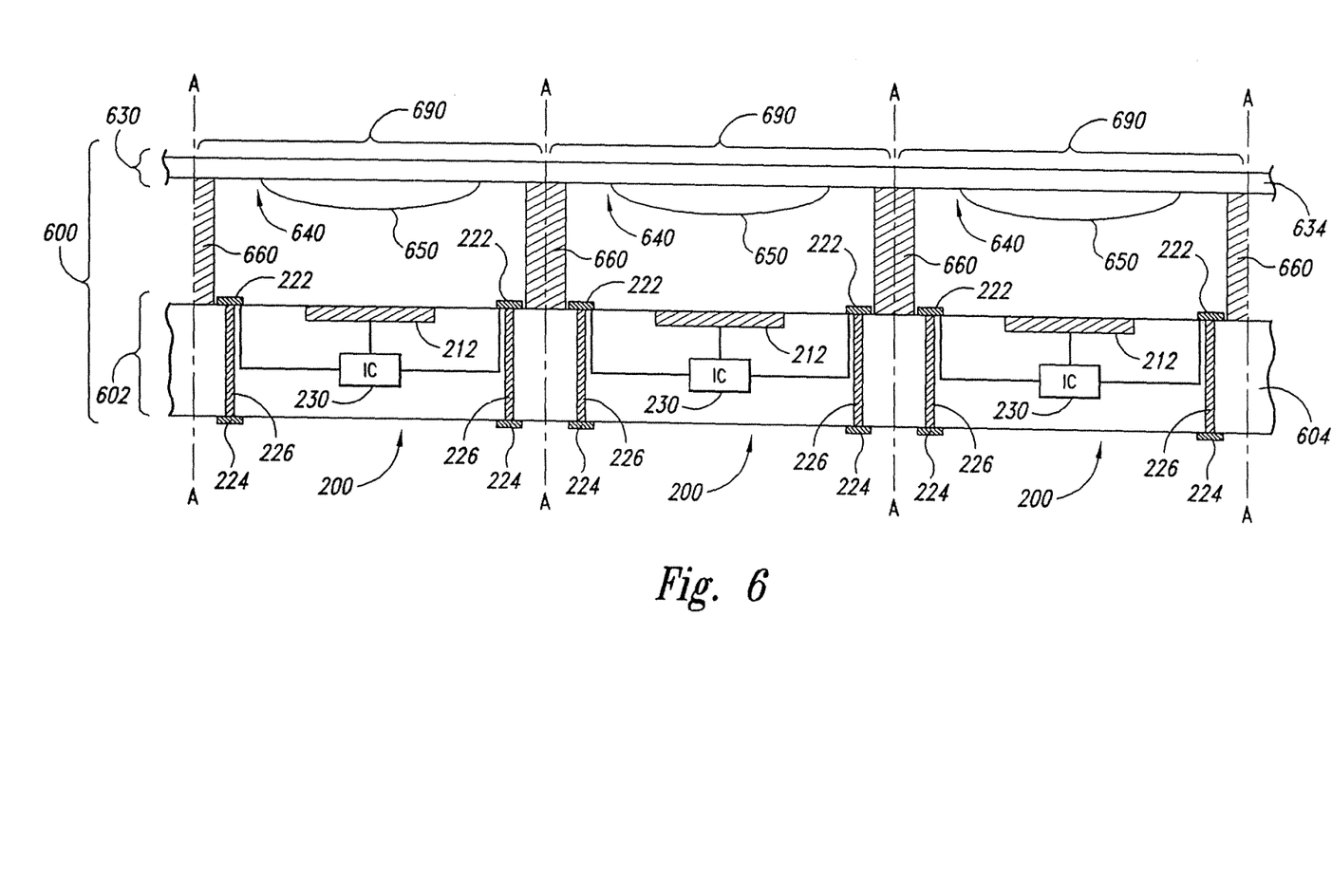
FIG. 6 is a schematic side cross-sectional view of an assembly including a microelectronic imager workpiece having a plurality of imaging dies and an optics workpiece having a plurality of optics units in accordance with an embodiment of the invention.

FIG. 6 is a schematic cross-sectional view of an assembly 600 including a plurality of microelectronic imagers 690 that each include an imaging die 200 and an optics unit 640. The assembly 600 includes a microelectronic imager workpiece 602 having a first substrate 604 and a plurality of imaging dies 200 formed on the first substrate 604. The individual imaging dies 200 can be generally similar to the imaging die 200 described above with respect to FIG. 2; like reference numbers accordingly refer to like components in FIGS. 2 and 6. The assembly 600 also includes an optics workpiece 630 that includes a second substrate 634 and a plurality of optics units 640 on the second substrate 634. Individual optic units 640 can include an optic member 650 on the second substrate 634.

The optic member 650 can include lenses and/or filters for focusing and filtering the radiation passing through the optics unit 640.

The assembly 600 further includes a plurality of stand-offs 660 configured to position individual optic units 640 with respect to individual image sensors 212. Suitable stand-offs are disclosed in U.S. patent application Ser. No. 10/723,363, entitled "Packaged Microelectronic Imagers and Methods of Packaging Microelectronic Imagers," filed on Nov. 26, 2003, which is incorporated by reference herein. The microelectronic imagers 690 can be assembled by seating the stand-offs 660 so that the optics units 640 are accurately aligned with the image sensors 212. In one embodiment, the stand-offs 660 are seated before singulating the individual imagers 690 such that all of the microelectronic imagers are assembled at the wafer level. Both of the first and second substrates 604 and 634 can then be cut along lines A-A to separate individual imagers 690 from each other.

One advantage of the assembly 600 of microelectronic imagers 690 illustrated in FIG. 6 is that the through-wafer interconnects 226 enable a plurality of microelectronic imagers to be fabricated at the wafer level using semiconductor fabrication techniques. Because the through-wafer interconnects 226 provide an array of ball-pads 224 on the backside of the imaging dies 200, it is not necessary to wire-bond the bond-pads 222 on the front side of the wafer to external devices. The bond-pads 222 can accordingly be covered at the wafer level. This enables the process of (a) fabricating a plurality of imaging dies 200 at the wafer level on one substrate, (b) fabricating a plurality of optics units 640 at the wafer level on another substrate, and (c) assembling a plurality of optic units 640 with a corresponding plurality of imaging dies 200 at the wafer level using automated equipment. Therefore, the microelectronic imagers 690 with through-wafer interconnects 226 enable processes that significantly enhance the throughput and accuracy of packaging microelectronic imagers.

Another advantage of the assembly 600 of microelectronic imagers 690 is the ability to decrease the real estate that the imagers 690 occupy in a cell phone, PDA, or other type of device. Because the imagers 690 do not require an interposer substrate to provide external electrical contacts in light of the through-wafer interconnects 226, the footprint of the imagers 690 can be the same as that of the die 200 instead of the interposer substrate. The area occupied by the imagers 690 is accordingly less than conventional imagers because the footprint of the individual imaging dies 200 is significantly smaller than that of the interposer substrate. Furthermore, because the dies 200 provide a backside array of ball-pads 224 that can be coupled directly to a module without an interposer substrate, the profile is lower and the time and costs associated with mounting the die to the interposer substrate are eliminated. This results in greater throughput, lower packaging costs, and smaller imagers.

A further advantage of wafer-level imager packaging is that the microelectronic imagers 690 can be tested from the backside of the dies 200 at the wafer level before the individual imagers 690 are singulated. A test probe can contact the backside of the dies 200 to test the individual microelectronic imagers 690 because the through-wafer interconnects 226 provide backside electrical contacts. Accordingly, because the test probe engages contacts on the backside of the imager workpiece 602, it will not damage the image sensors 212, the optics units 640, or associated circuitry on the front of the microelectronic imagers 690. Moreover, the test probe does not obstruct the image sensors 212 during a backside test, which allows the test probe to test a larger number of dies at one time compared to processes that test imaging dies from the front side. As such, it is more efficient in terms of cost and time to test the microelectronic imagers 690 at the wafer level (i.e., before singulation) than to test each imager 690 from the front side of the dies 200. Furthermore, it is advantageous to test the microelectronic imagers 690 in an environment where the individual image sensors 212 and/or optics units 640 will not be damaged during testing.

Yet another advantage of wafer-level processing is that the microelectronic imagers 690 can be singulated after assembling the optics units 640 to the dies 200. The attached optics units 640 protect the imager sensors 212 on the front side of the dies 200 from particles generated during the singulation process. Thus, the likelihood that the image sensors 212 or associated circuitry on the front side of the dies 200 will be damaged during singulation and subsequent handling is significantly reduced.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Accordingly, the invention is not limited except as by the appended claims.

We claim:

1. A method of manufacturing a microelectronic imaging die, the method comprising:
   providing a microelectronic substrate, the substrate including an integrated circuit and an image sensor electrically coupled to the integrated circuit;
   forming a terminal on and/or in the substrate, wherein the terminal is electrically coupled to the integrated circuit;
   forming a passage through the substrate and the terminal;
   constructing an electrically conductive interconnect in at least a portion of the passage and contacting the terminal; and
   filling the portion of the passage not occupied by the electrically conductive interconnect with a conductive fill material.

2. The method of claim 1, further comprising applying a dielectric layer to the substrate, the dielectric layer covering at least a portion of the terminal.

3. The method of claim 1, further comprising applying a dielectric liner to at least a portion of the passage before constructing the interconnect.

4. The method of claim 1, further comprising;
   cleaning the passage after forming the passage through the substrate and the terminal; and
   applying a dielectric liner to at least a portion of the passage before depositing the conductive fill material into the passage.

5. The method of claim 1, further comprising applying a conductive layer to at least a portion of the passage before depositing the conductive fill material into the passage.

6. The method of claim 5 wherein the material for the conductive layer comprises one or more of TiN, TaN, W, WN, Ta, Ti, Al, Cu, Ag, Ni, Cu, Co and Au.

7. The method of claim 1, further comprising applying a wetting agent to at least a portion of the passage before depositing the conductive fill material into the passage.

8. The method of claim 7 wherein the wetting agent comprises Ni, Cu or Au.

9. The method of claim 1, further comprising:
   applying a dielectric liner to at least a portion of the passage;

applying a conductive layer over at least a portion of the dielectric liner, wherein the conductive layer includes one or more of TiN, TaN, W, WN, Ta, Ti, Al, Cu, Ag, Ni, Cu, Co and Au; and applying a wetting agent over at least a portion of the conductive layer before depositing the conductive fill material into the passage, wherein the wetting agent includes Ni, Cu, or Au.

10. The method of claim 1 wherein forming the passage includes laser-cutting a through-hole completely through the substrate and terminal.

11. The method of claim 1, further comprising forming a hole in the terminal before forming the passage through the substrate and the terminal, wherein the hole in the terminal has a first cross-sectional dimension and the passage has a second cross-sectional dimension, and wherein the second cross-sectional dimension is less than the first cross-section dimension.

12. The method of claim 1, further comprising:
forming a hole through the terminal; and
filling the hole with a dielectric material, and wherein forming the passage through the substrate and the terminal includes cutting a through-hole completely through the substrate and the dielectric material.

13. A method of forming an electrically conductive interconnect in a microelectronic imaging die, the die including a microelectronic substrate, an image sensor, an integrated circuit in the substrate and electrically coupled to the image sensor, and a bond-pad electrically coupled to the integrated circuit, the method comprising:
forming a hole in the bond-pad;
forming a via completely through the substrate in alignment with the hole in the bond-pad, wherein the via and the hole define a passage extending completely through the substrate and the bond-pad;
constructing an electrically conductive interconnect in at least a portion of the passage and contacting the bond-pad;
depositing a conductive fill material so that it fills the passage portion not occupied by the electrically conductive interconnect; and
forming a conductive cap at one end of the interconnect to electrically couple the interconnect and bond-pad.

14. The method of claim 13, further comprising applying a dielectric liner to at least a portion of the passage before constructing the interconnect.

15. The method of claim 13, further comprising:
cleaning the passage after forming the passage through the substrate and the bond-pad; and
applying a dielectric liner to at least a portion of the passage before depositing an electrically conductive material for the interconnect into at least a portion of the passage.

16. The method of claim 13, further comprising filling the hole in the bond-pad with a dielectric material, wherein forming a via through the substrate and the bond-pad includes forming a via through the substrate and the dielectric material filling the hole in the bond-pad.

17. The method of claim 13 wherein forming the passage includes laser-cutting a through-hole completely through the substrate.

18. The method of claim 13 wherein the hole has a first cross-sectional dimension and the via has a second cross-sectional dimension, and wherein the first cross-section dimension is larger than the second cross-sectional dimension.

19. The method of claim 13, wherein depositing the conductive fill material is done using a method selected from the group consisting of a solder wave process, electroplating, stenciling, placing a pre-formed sphere of metal in the passage and melting the sphere, and injecting flowable material into the passage.

20. The method of claim 13, wherein the conductive cap is formed by electroplating Ni onto the interconnect.

21. The method of claim 13 wherein the conductive cap is formed to be part of the conductive fill material.

22. A method of manufacturing a microelectronic workpiece having a plurality of imaging dies, the individual dies including an integrated circuit, an image sensor, and a bond-pad array electrically coupled to the integrated circuit, the method comprising:
forming a plurality of passages completely through each die and bond-pad;
removing a first type of material from the portion of each passage corresponding to the die using a first cleaning agent;
removing a second type of material from the portion of each passage corresponding to the bond-pad using a second cleaning agent; and
constructing an electrically conductive interconnect in at least a portion of each passage and contacting the corresponding bond-pad.

23. The method of claim 22, further comprising singulating the imaging dies from each other.

24. The method of claim 22, further comprising providing a plurality of referencing elements on each individual die, wherein the referencing elements are configured to position an optics unit at a desired location relative to the image sensor on each die, and wherein an optics unit is coupled to each individual die.

25. The method of claim 22 wherein the first cleaning agent is different from the second cleaning agent.

26. A method of forming a through-wafer interconnect in an imaging die, the method comprising:
forming a substrate comprising a first side, a second side, and a bond pad on the first side;
applying a first and second dielectric layer to the first side of the substrate, wherein the first dielectric layer surrounds the bond pad and the second dielectric layer surrounds and covers the bond pad;
exposing the bond pad by removing a portion of the second dielectric layer;
forming a first hole through the bond pad;
forming a second hole from the second side and through the substrate such that the second hole joins the first hole to form a continuous through-hole;
applying a third dielectric layer to cover the sidewall of the through-hole; and
applying a first conductive layer in the through hole and over the third dielectric layer.

27. The method of claim 26 further comprising:
removing, from an area surrounding the bond pad, a portion of at least one of the first and second dielectric layers;
removing a portion of the first conductive layer from the horizontal and diagonal surfaces of the imaging die;
applying a second conductive layer over the remaining portion of the first conductive layer in the through-hole; and
depositing a conductive fill material into the through-hole to form an interconnect extending through the substrate and bond pad, wherein the conductive fill material fills the through-hole.

28. The method of claim 27 further comprising:
forming a conductive cap at one end of the interconnect to electrically couple the interconnect and the bond pad.

29. The method of claim 28 wherein the conductive cap is formed of a conductive material different from the material used for the interconnect.

30. The method of claim 26 further comprising applying a fourth dielectric layer over the second dielectric layer.

31. The method of claim 26 further comprising cleaning the through-hole using a wet-etch process.

32. The method of claim 31 wherein cleaning the through-hole using a wet etch process further comprises:

a first cleaning step to clean material resulting from forming the first hole through the bond pad; and
a second cleaning step to clean material resulting from forming the second hole through the substrate.

33. The method of claim 26 wherein the first hole is formed to have a cross-sectional area greater than the second hole.

34. The method of claim 26 wherein forming the first hole through the bond pad is conducted simultaneously with forming the second hole through the substrate, and the formed through-hole has a single, continuous cross-sectional area.

* * * * *